United States Patent
Yosui et al.

(10) Patent No.: US 10,741,303 B2
(45) Date of Patent: *Aug. 11, 2020

(54) TRANSMISSION LINE, FLAT CABLE, AND ELECTRONIC DEVICE

(71) Applicant: Murata Manufacturing Co., Ltd., Nagaokakyo-shi, Kyoto-fu (JP)

(72) Inventors: Kuniaki Yosui, Nagaokakyo (JP); Shingo Ito, Nagaokakyo (JP); Shuichi Kezuka, Nagaokakyo (JP); Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/293,899

(22) Filed: Mar. 6, 2019

(65) Prior Publication Data
US 2019/0198195 A1    Jun. 27, 2019

Related U.S. Application Data

(63) Continuation of application No. 15/465,633, filed on Mar. 22, 2017, now Pat. No. 10,269,469, which is a (Continued)

(30) Foreign Application Priority Data

Oct. 10, 2014    (JP) .................. 2014-209525

(51) Int. Cl.
*H01B 7/08*    (2006.01)
*H01P 3/08*    (2006.01)
(Continued)

(52) U.S. Cl.
CPC ............... *H01B 7/08* (2013.01); *H01P 3/026* (2013.01); *H01P 3/082* (2013.01); *H05K 1/0219* (2013.01);
(Continued)

(58) Field of Classification Search
CPC combination set(s) only.
See application file for complete search history.

(56) References Cited

U.S. PATENT DOCUMENTS 3,244,795 A * 4/1966 Latimer ............... H05K 3/4635
174/259
3,447,120 A * 5/1969 Rask ..................... H01B 7/083
439/497
(Continued)

OTHER PUBLICATIONS

Yosui et al., "Transmission Line and Flat Cable", U.S. Appl. No. 15/465,633, filed Mar. 22, 2017.

*Primary Examiner* — Binh B Tran
*Assistant Examiner* — Krystal Robinson
(74) *Attorney, Agent, or Firm* — Keating & Bennett, LLP (57) ABSTRACT

A transmission line includes, in a stacked insulator in which insulator layers are stacked, a first transmission line portion including a first ground conductor pattern, a second ground conductor pattern, and a first signal conductor pattern, and a second transmission line portion including a third ground conductor pattern, a fourth ground conductor pattern, and a second signal conductor pattern. The first signal conductor pattern extends along the second signal conductor pattern. The first ground conductor pattern and the third ground conductor pattern are provided on different insulator layers and at least partially overlap each other in a plan view.

15 Claims, 8 Drawing Sheets

Related U.S. Application Data continuation of application No. PCT/JP2015/078143, filed on Oct. 5, 2015.

(51) Int. Cl.
*H05K 1/02* (2006.01)
*H01P 3/02* (2006.01)
*H05K 1/14* (2006.01)

(52) U.S. Cl.
CPC .......... *H05K 1/0225* (2013.01); *H05K 1/147* (2013.01); *H05K 2201/052* (2013.01); *H05K 2201/10037* (2013.01); *H05K 2201/10189* (2013.01)

(56) References Cited

U.S. PATENT DOCUMENTS

| | | | | |
|---|---|---|---|---|
| 5,145,387 A * | 9/1992 | Ichihashi | ........... | H01R 13/6474 439/108 |
| 5,527,998 A * | 6/1996 | Anderson | ........... | H05K 3/361 174/254 |
| 7,256,345 B2 * | 8/2007 | Inoue | ........... | B32B 15/02 174/110 R |
| 7,999,186 B2 * | 8/2011 | Sugita | ........... | B41J 2/04541 174/117 F |
| 9,019,048 B1 * | 4/2015 | Yosui | ........... | H05K 1/0253 333/238 |
| 2003/0063872 A1 * | 4/2003 | Govan Date | ........... | H04B 10/40 385/92 |
| 2003/0214860 A1 * | 11/2003 | Greenlaw | ........... | H05K 1/025 365/200 |
| 2006/0042826 A1 * | 3/2006 | Kondo | ........... | H05K 3/4617 174/255 |
| 2007/0040626 A1 * | 2/2007 | Blair | ........... | H01P 3/006 333/1 |
| 2008/0236868 A1 * | 10/2008 | Koga | ........... | H01R 12/594 174/117 F |
| 2010/0201462 A1 * | 8/2010 | Blair | ........... | H01P 3/006 333/238 |
| 2011/0036615 A1 * | 2/2011 | Noda | ........... | H05K 1/0245 174/117 F |
| 2013/0207740 A1 * | 8/2013 | Kato | ........... | H01P 3/082 333/33 |
| 2015/0018055 A1 * | 1/2015 | Yosui | ........... | H05K 1/0221 455/575.1 |
| 2015/0036303 A1 * | 2/2015 | Yosui | ........... | H05K 1/115 361/752 |
| 2015/0295296 A1 * | 10/2015 | Ikemoto | ........... | H01Q 21/0075 343/893 |

\* cited by examiner

TRANSMISSION LINE, FLAT CABLE, AND ELECTRONIC DEVICE

CROSS REFERENCE TO RELATED APPLICATIONS

This application claims the benefit of priority to Japanese Patent Application No. 2014-209525 filed on Oct. 10, 2014 and is a Continuation Application of PCT Application No. PCT/JP2015/078143 filed on Oct. 5, 2015. The entire contents of each application are hereby incorporated herein by reference.

BACKGROUND OF THE INVENTION

1. Field of the Invention

The present invention relates to a transmission line and a flat cable that transmit a plurality of high frequency signals.

2. Description of the Related Art

Various transmission lines that transmit a high frequency signal have been devised. For example, Japanese Patent Laid-Open publication No. H04-144301 discloses a transmission line with a stripline structure. The transmission line disclosed in Japanese Patent Laid-Open publication No. H04-144301 is provided with an elongated stacked insulator that extends in a direction in which a high frequency signal is transmitted, a plurality of signal lines, a first ground conductor, and a second ground conductor. The plurality of signal lines are arrayed in parallel to the first ground conductor and the second ground conductor, alternately being shifted vertically to each other. With this configuration, the characteristic impedance of the signal lines is matched with a predetermined value, which makes it possible to arrange the plurality of signal lines with high density.

In a transmission line including the structure disclosed in Japanese Patent Laid-Open publication No. H04-144301, it is difficult to adjust the impedance of each signal line to a desired impedance. In addition, since a ground layer that overlaps in a stacking direction is shared, coupling through the ground layer is likely to occur. In other words, leakage of a signal between transmission lines due to a feedback current is likely to occur.

On the other hand, a structure in which, by arranging an interlayer connection conductor between signal lines, unwanted coupling between adjacent signal lines is significantly reduced or prevented by the interlayer connection conductor, is able to be considered.

In such a configuration in which an interlayer connection conductor is arranged between adjacent signal lines, however, the following problems may occur.

In a case of using a structure in which the pitch of the interlayer connection conductor arranged between the adjacent signal lines is made rough or a structure in which the interlayer connection conductor is eliminated, unwanted coupling between the signal lines is likely to occur. On the other hand, if the pitch of the interlayer connection conductor is made fine, the capacitance between the signal line and the interlayer connection conductor becomes larger and a desired characteristic impedance as a transmission line is difficult to be achieved.

As the width of the stacked insulator is smaller, the capacitance that is generated between the interlayer connection conductor and the signal line becomes larger and thus a desired characteristic impedance as a transmission line is difficult to be achieved.

SUMMARY OF THE INVENTION

Preferred embodiments of the present invention provide a transmission line and a flat cable that are provided with a plurality of transmission line portions in a single stacked insulator and that significantly reduce or prevent unwanted coupling between the plurality of transmission line portions.

A transmission line according to a preferred embodiment of the present invention includes: a stacked insulator in which a plurality of insulator layers are stacked; and a conductor pattern arranged along at least one of the plurality of insulator layers in the stacked insulator, and the conductor pattern includes: a first transmission line portion including: a first ground conductor pattern; a second ground conductor pattern; and a first signal conductor pattern, and a second transmission line portion including a third ground conductor pattern; a fourth ground conductor pattern; and a second signal conductor pattern; the first signal conductor pattern extends along the second signal conductor pattern; the first ground conductor pattern, the second ground conductor pattern, the third ground conductor pattern, and the fourth ground conductor pattern are conductor patterns each of which has a width larger than a width of each of the first signal conductor pattern and the second signal conductor pattern; the first ground conductor pattern and the second ground conductor pattern are respectively located on one side and another side of the first signal conductor pattern in a stacking direction of the plurality of insulator layers; the first signal conductor pattern, in a plan view, overlaps the first ground conductor pattern and the second ground conductor pattern and does not overlap at least one of the third ground conductor pattern and the fourth ground conductor pattern; the third ground conductor pattern and the fourth ground conductor pattern are respectively located on one side and another side of the second signal conductor pattern in the stacking direction of the plurality of insulator layers; the second signal conductor pattern, in a plan view, overlaps the third ground conductor pattern and the fourth ground conductor pattern and does not overlap at least one of the first ground conductor pattern and the second ground conductor pattern; and at least the first ground conductor pattern and the third ground conductor pattern are provided on different insulator layers among the plurality of insulator layers and at least partially overlap each other in a plan view.

Due to at least the first ground conductor pattern and the third ground conductor pattern being separated from each other, coupling through a ground conductor pattern (the first ground conductor pattern and the third ground conductor pattern) is significantly reduced or prevented. Therefore, even if the distance between the first signal conductor pattern and the second signal conductor pattern is made comparatively small, a predetermined isolation is able to be ensured and thus the width of the entire transmission line is able to be reduced. In addition, by the first ground conductor pattern and the third ground conductor pattern overlapping each other in a plan view, undesired radiation is significantly reduced or prevented.

According to a preferred embodiment of the present invention, the second ground conductor pattern and the fourth ground conductor pattern may be provided on different insulator layers among the plurality of insulator layers and at least partially overlap each other in a plan view; the first ground conductor pattern and the second ground conductor pattern may preferably extend in a direction in which the first signal conductor pattern extends; and the third ground conductor pattern and the fourth ground conductor pattern may preferably extend in a direction in which the second signal conductor pattern extends.

Due to the second ground conductor pattern and the fourth ground conductor pattern being separated from each other, coupling through a ground conductor pattern (the second ground conductor pattern and the fourth ground conductor pattern) is also significantly reduced or prevented.

According to a preferred embodiment of the present invention, the first ground conductor pattern, the second ground conductor pattern, and the first signal conductor pattern that define the first transmission line portion may preferably be respectively offset in the stacking direction of the plurality of insulator layers with respect to the third ground conductor pattern, the fourth ground conductor pattern, and the second signal conductor pattern that define the second transmission line portion.

By increasing the three dimensional distance between the first signal conductor pattern and the second signal conductor pattern, isolation between the two transmission line portions is able to be increased.

According to a preferred embodiment of the present invention, the distance between the third ground conductor pattern and the fourth ground conductor pattern in the stacking direction of the plurality of insulator layers may preferably be larger than the distance between the first ground conductor pattern and the second ground conductor pattern in the stacking direction of the plurality of insulator layers; and a line width of the second signal conductor pattern may preferably be larger than a line width of the first signal conductor pattern.

While the impedance of the first transmission line portion provided with the first signal conductor pattern and the impedance of the second transmission line portion provided with the second signal conductor pattern are equal or approximately equal to each other, the transmission loss of the second transmission line portion is able to be reduced. Accordingly, the first transmission line portion and the second transmission line portion are able to be provided according to predetermined or desired constraints of transmission loss.

According to a preferred embodiment of the present invention, the first signal conductor pattern and the second signal conductor pattern may be provided on different insulator layers among the plurality of insulator layers.

By increasing the three dimensional distance between the first signal conductor pattern and the second signal conductor pattern, the isolation between the two transmission line portions is able to be increased.

A flat cable according to a preferred embodiment of the present invention includes: a transmission line; and a connector electrically connected to the transmission line, and the transmission line is the transmission line according to any one of the preferred embodiments of the present invention described above, and the connector is mounted on the stacked insulator of the transmission line.

Thus, a flat cable in which the unwanted coupling between the plurality of transmission line portions is significantly reduced or prevented and undesired radiation is significantly reduced or prevented is able to be provided and is able to include a small size.

According to various preferred embodiments of the present invention, coupling through a ground conductor pattern between a first transmission line including a first signal conductor pattern, a first ground conductor pattern, and a second ground conductor pattern and a second transmission line including a second signal conductor pattern, a first ground conductor pattern, and a third ground conductor pattern is significantly reduced or prevented. In addition, the undesired radiation by the ground conductor pattern being separated is significantly reduced or prevented. Furthermore, even if the distance between the first signal conductor pattern and the second signal conductor pattern is made comparatively small, a predetermined isolation is able to be provided and thus the width of the entire transmission line is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, a plurality of preferred embodiments of the present invention will be described with reference to the attached drawings and several specific examples. In the drawings, components and elements identified by the same reference numerals or symbols will represent identical components and elements. In preferred embodiments after the first preferred embodiment, a description of matters common to the first preferred embodiment will be omitted, and different matters are mainly described. In particular, the same operational effects by the same configuration will not be described one by one for each preferred embodiment.

First Preferred Embodiment

Figure 1:
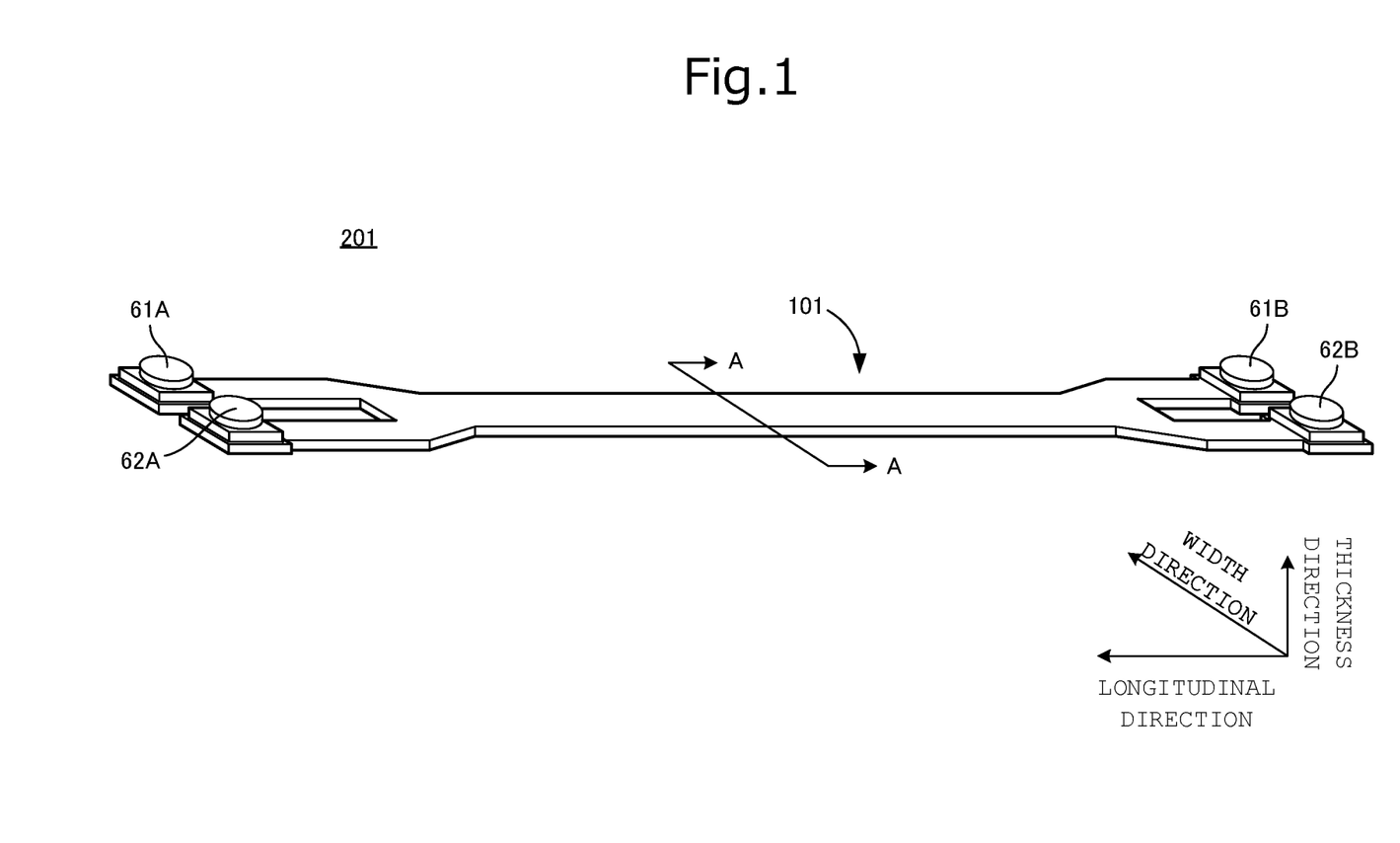
FIG. 1 is an external perspective view of a transmission line and a flat cable according to a first preferred embodiment of the present invention.

FIG. 1 is an external perspective view of a flat cable 201 according to a first preferred embodiment of the present invention. The flat cable 201 includes a transmission line 101 and coaxial connectors 61A, 61B, 62A, and 62B mounted on the transmission line 101. The transmission line 101 includes a first transmission line portion and a second transmission line portion. The longitudinal direction of the transmission line 101 is a direction in which a high frequency signal is transmitted. The coaxial connectors 61A and 61B are provided at both ends of the first transmission line portion and the coaxial connectors 62A and 62B are provided at both ends of the second transmission line portion.

Figure 2:
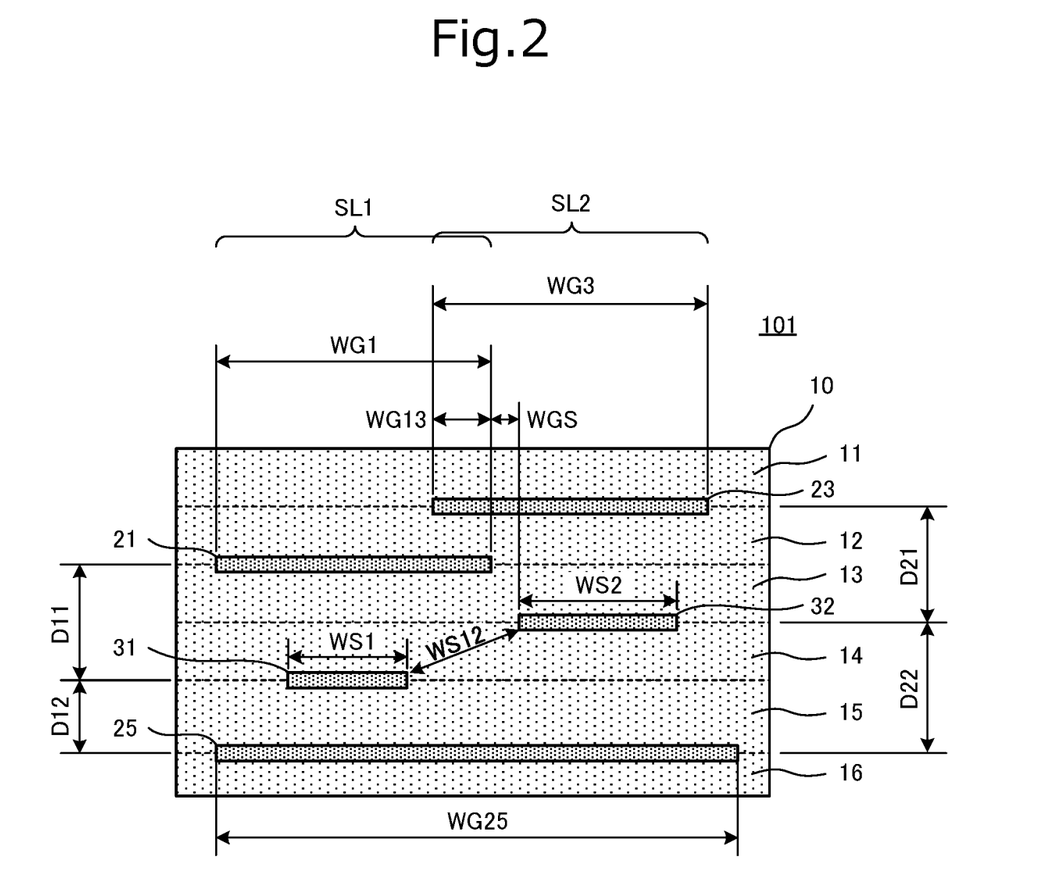
FIG. 2 is a cross-sectional view of a portion of the transmission line shown in FIG. 1.

FIG. 2 is a cross-sectional view of an A-A portion of the transmission line 101 shown in FIG. 1. The transmission line 101 is provided with a stacked insulator 10 in which a plurality of insulator layers 11, 12, 13, 14, 15 and 16 are stacked, and various conductor patterns arranged along the plurality of insulator layers 11 to 16 in the stacked insulator 10.

The conductor pattern includes a first ground conductor pattern 21 arranged along the insulator layer 13, a second-fourth common ground conductor pattern 25 arranged along the insulator layer 16, a third ground conductor pattern arranged along the insulator layer 12, a first signal conductor pattern 31 arranged along the insulator layer 15, and a second signal conductor pattern 32 arranged along the insulator layer 14.

The first signal conductor pattern 31 and the second signal conductor pattern 32 are parallel or substantially parallel to each other and extend in the longitudinal direction, as shown in FIG. 1. The first signal conductor pattern 31 is arranged on a layer between the first ground conductor pattern 21 and the second-fourth common ground conductor pattern 25, and the second signal conductor pattern 32 is arranged on a layer between the third ground conductor pattern 23 and the second-fourth common ground conductor pattern 25. The distance between the first signal conductor pattern 31 and the second signal conductor pattern 32 is not necessarily constant as long as the first signal conductor pattern 31 and the second signal conductor pattern 32 are parallel or substantially parallel to each other. In other words, the first signal conductor pattern 31 is only preferably arranged to extend along the second signal conductor pattern 32.

Figure 3:
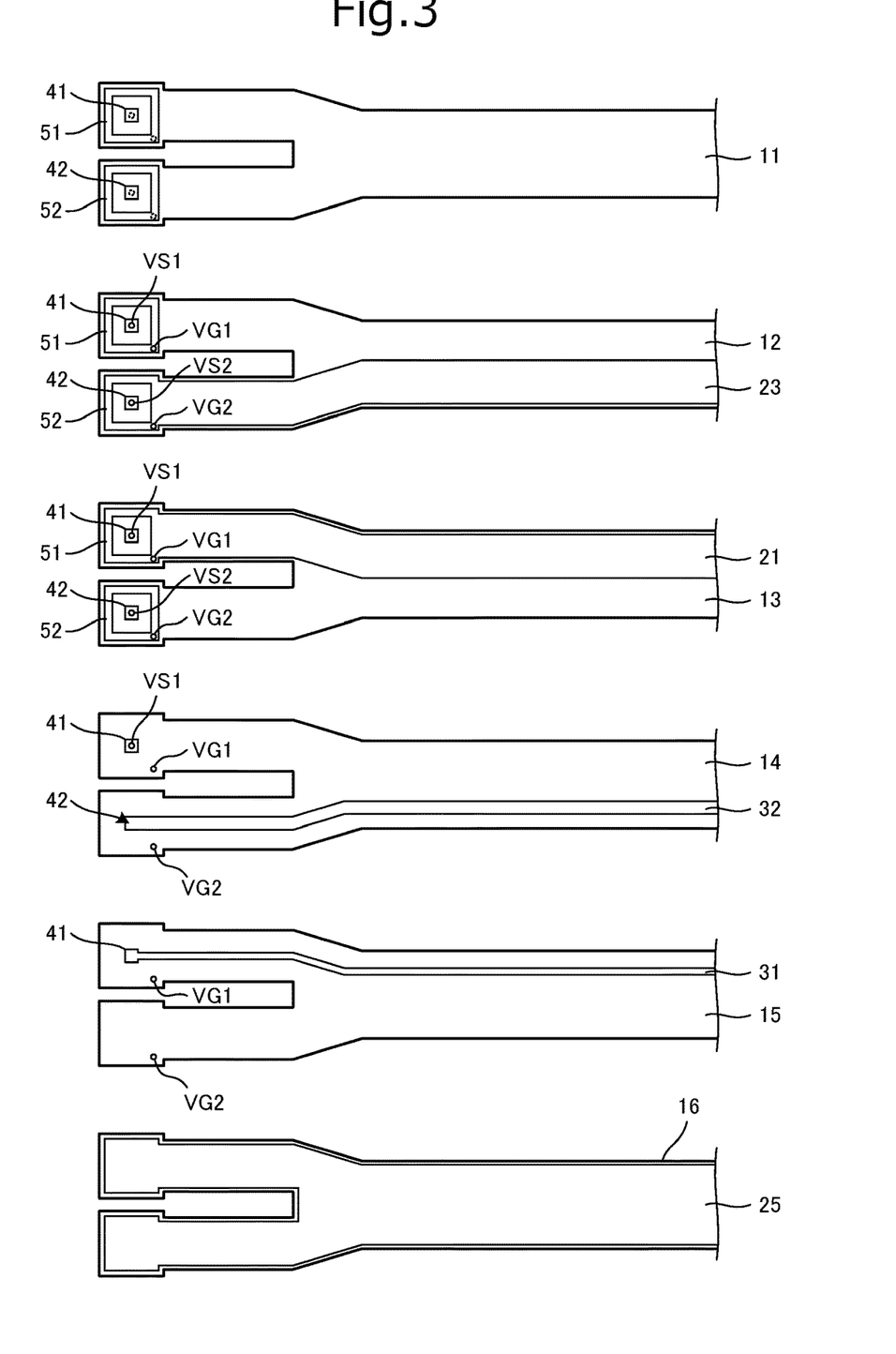
FIG. 3 is a partial plan view showing each insulator layer provided in the transmission line and various conductor patterns that are each provided on the insulator layer.

FIG. 3 is a partial plan view showing each insulator layer provided in the transmission line 101 and various conductor patterns that are each provided on the insulator layer. The insulator layers 11, 12, 13, 14, and 15 include an internal conductor pattern 41 to mount a coaxial connector, and the insulator layers 11, 12, 13, and 14 include an internal conductor pattern 42 to mount a coaxial connector. The insulator layers 11, 12, and 13 include both an external conductor pattern 51 to mount a coaxial connector and an external conductor pattern 52 to mount a coaxial connector.

The insulator layer 12 includes the third ground conductor pattern 23, and the insulator layer 13 includes the first ground conductor pattern 21. The insulator layer 14 includes the second signal conductor pattern 32, and the insulator layer 15 includes the first signal conductor pattern 31. The insulator layer 16 includes the second-fourth common ground conductor pattern 25.

The internal conductor patterns 41 to mount a coaxial connector provided on the insulator layers 11, 12, 13, 14, and 15 are electrically connected to each other through a via conductor VS1, and the internal conductor patterns 42 to mount a coaxial connector provided on the insulator layers 11, 12, 13, and 14 are electrically connected to each other through a via conductor VS2. In addition, the external conductor patterns 51 to mount a coaxial connector provided on the insulator layers 11, 12, and 13 are electrically connected to each other through a via conductor VG1, and the external conductor patterns 52 to mount a coaxial connector provided on the insulator layers 11, 12, and 13 are electrically connected to each other through a via conductor VG2. The coaxial connector 61A, shown in FIG. 1, is mounted on and electrically bonded to the internal conductor pattern 41 to mount a coaxial connector and the external conductor pattern 51 to mount a coaxial connector. Similarly, the coaxial connector 62A is mounted on and electrically bonded to the internal conductor pattern 42 to mount a coaxial connector and the external conductor pattern 52 to mount a coaxial connector. While FIG. 3 shows features of substantially half of the area of the transmission line 101, the features of the remaining half of the area of the transmission line 101 is also the same or substantially the same.

The first ground conductor pattern 21 and the second-fourth common ground conductor pattern 25 are electrically connected to each other through the via conductor VG1, and the third ground conductor pattern 23 and the second-fourth common ground conductor pattern 25 are electrically connected to each other through the via conductor VG2. In other words, such electrical connections are respectively provided by the external conductor pattern 51 to mount a coaxial connector and the external conductor pattern 52 to mount a coaxial connector. Other than by the external conductor pattern 51 to mount a coaxial connector and the external conductor pattern 52 to mount a coaxial connector, the first ground conductor pattern 21 and the second-fourth common ground conductor pattern 25 are not electrically connected to each other, and the third ground conductor pattern 23 and the second-fourth common ground conductor pattern 25 are not electrically connected to each other. In other words, the first ground conductor pattern 21 and the third ground conductor pattern 23 are electrically separated from each other.

The insulator layers 11 to 16 on which the various conductor patterns are provided are stacked and bonded to each other by thermocompression, which provides the stacked insulator 10 with the cross-sectional structure shown in FIG. 2.

The flat cable 201 is able to be made flexible by mounting a coaxial connector on each of the external conductor pattern 51 to mount a coaxial connector and the external conductor pattern 52 to mount a coaxial connector of the stacked insulator 10.

Accordingly, the first signal conductor pattern 31, the first ground conductor pattern 21, and the second-fourth common ground conductor pattern 25 provide a first transmission line portion SL1 with a stripline structure. In addition, the second signal conductor pattern 32, the third ground conductor pattern 23, and the second-fourth common ground conductor pattern 25 provide a second transmission line portion SL2 with a stripline structure. However, even if members other than the conductors are included, the insulator layers 13, 14, and 15 as dielectric and support layers, together with the first signal conductor pattern 31, the first ground conductor pattern 21, and the second-fourth common ground conductor pattern 25, are components of the first transmission line portion SL1. Similarly, the insulator layers 12, 13, 14, and 15, together with the second signal conductor pattern 32, the third ground conductor pattern 23, and the second-fourth common ground conductor pattern 25, are also the components of the second transmission line portion SL2.

In a plan view (as viewed in the stacking direction of the plurality of insulator layers), first signal conductor pattern 31 overlaps with the first ground conductor pattern 21 and the second-fourth common ground conductor pattern 25 and does not overlap the third ground conductor pattern 23. Similarly, in the plan view, the second signal conductor pattern 32 overlaps the third ground conductor pattern 23 and the second-fourth common ground conductor pattern 25 and does not overlap the first ground conductor pattern 21.

The width WG1 of the first ground conductor pattern and the width WG25 of the second-fourth common ground conductor pattern 25 are larger than the width WS1 of the first signal conductor pattern 31. In addition, the width WG3 of the third ground conductor pattern 23 and the width WG25 of the second-fourth common ground conductor pattern 25 are larger than the width WS2 of the second signal conductor pattern 32.

When a distance between the first signal conductor pattern 31 and the first ground conductor pattern 21 is indicated by D11, a distance between the first signal conductor pattern 31 and the second-fourth common ground conductor pattern 25 is indicated by D12, a distance between the second signal conductor pattern 32 and the third ground conductor pattern 23 is indicated by D21, and a distance between the second signal conductor pattern 32 and the second-fourth common ground conductor pattern 25 is indicated by D22, the distance D21 and the distance D22 are preferably larger than the distance D11 and the distance D12. The width WS2 of the second signal conductor pattern 32 is preferably larger than the width WS1 of the first signal conductor pattern 31. According to this dimensional relationship, while the characteristic impedance of the first transmission line portion SL1 and the characteristic impedance of the second transmission line portion SL2 are matched with or approximate to each other, the transmission loss of the second transmission line portion SL2 is able to be reduced. Accordingly, the first transmission line portion SL1 and the second transmission line portion SL2 are able to be provided according to predetermined or desired constraints of transmission loss. For example, the first transmission line portion SL1 may be implemented as a transmission line for a low band communication signal, and the second transmission line portion SL2 may be implemented as a transmission line for a high band communication signal. In general, as the frequency of a signal to be transmitted becomes higher, the resistance loss by a skin effect increases and the dielectric loss by the dielectric loss tangent of an insulator layer also increases. Therefore, when a high band is compared with a low band, significant reduction or prevention of the transmission loss of a high band signal is desirable. Thus, as described above, it is preferable that the second transmission line portion SL2 in which the distance between a signal conductor pattern and a ground conductor pattern is large and the width of the signal conductor pattern is large is set as a transmission line portion for a high band.

As shown in FIG. 2, the first ground conductor pattern 21 and the third ground conductor pattern 23 overlap each other by a distance WG13 in a plan view. Accordingly, the first ground conductor pattern 21 and the third ground conductor pattern 23 are provided on different insulator layers among the plurality of insulator layers and at least partially overlap each other in the plan view. According to this structure, coupling through the first ground conductor pattern 21 and the third ground conductor pattern 23 is able to be significantly reduced or prevented. Therefore, even if the distance between the first signal conductor pattern 31 and the second signal conductor pattern 32 is made comparatively small, a predetermined isolation is able to be provided and thus the width of the entire transmission line is able to be reduced. In addition, the first ground conductor pattern 21 and the third ground conductor pattern 23 are stacked and overlap in a plan view, and the undesired radiation toward the surface (an upward direction in FIG. 2) on which the first ground conductor pattern 21 and the third ground conductor pattern 23 are provided is able to be significantly reduced or prevented.

As shown in FIG. 2, the first signal conductor pattern 31 and the second signal conductor pattern 32 are spaced from each other by a distance WS12. Moreover, the first ground conductor pattern 21 and the second signal conductor pattern 32 are spaced from each other by a plane distance WGS. In the first preferred embodiment, since the layer on which the first signal conductor pattern 31 is provided is different from the layer on which the second signal conductor pattern 32 is provided, even if the plane distance between the first signal conductor pattern 31 and the second signal conductor pattern 32 is reduced, a sufficient distance as a spacing distance WS12 between the first signal conductor pattern 31 and the second signal conductor pattern 32 is able to be provided. In addition, if the plane distance WGS between the first ground conductor pattern 21 and the second signal conductor pattern 32 is increased (if not to overlap at least in a plan view, for example), the capacitance that is generated between the first ground conductor pattern 21 and the second signal conductor pattern 32 is comparatively small. Accordingly, leakage of a signal between the transmission lines due to the feedback current through the first ground conductor pattern 21 is able to be significantly reduced or prevented.

Accordingly, while crosstalk between the first transmission line and the second transmission line is significantly reduced or prevented, the width of the entire transmission line is able to be reduced.

Figure 4A:
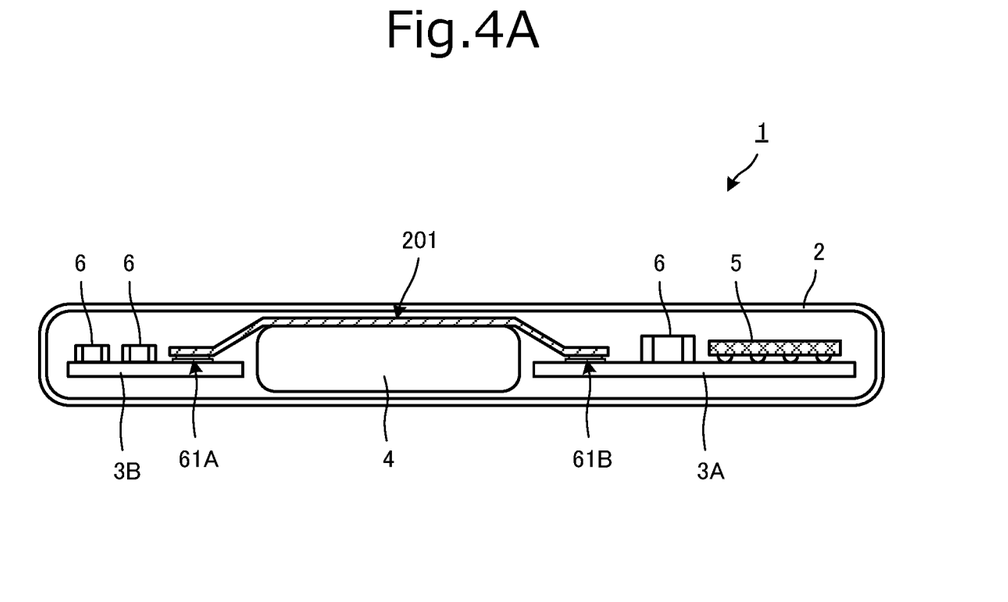
FIG. 4A is a cross-sectional view of a portable electronic device, showing a mounting state of the flat cable according to the first preferred embodiment of the present invention
Figure 4B:
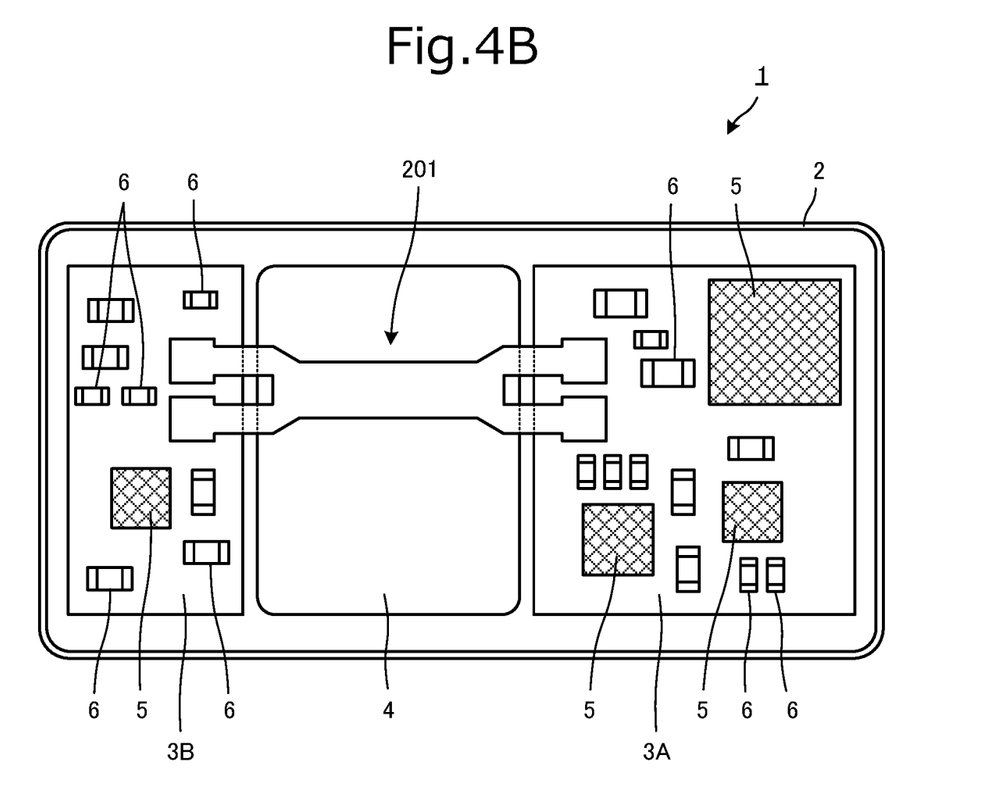
FIG. 4B is a plan view of an inside of a housing of the portable electronic device.

FIG. 4A is a cross-sectional view of a portable electronic device, showing a mounting state of the flat cable 201 according to the first preferred embodiment and FIG. 4B is a plan view of an inside of a housing of the portable electronic device.

The portable electronic device 1 is provided with a thin housing 2. Circuit boards 3A and 3B and a battery pack 4 are arranged in the housing 2. A plurality of integrated circuits (IC) 5 and chip components 6 are mounted on the surfaces of the circuit boards 3A and 3B. In the housing 2, the battery pack 4 may be arranged between the circuit board 3A and 3B in a plan view of the housing 2. Preferably, the housing 2 is as thin as possible, and the space between the battery pack 4 and the housing 2 in the thickness direction of the housing 2 is extremely small. Preferably, the space between the battery pack 4 and the housing 2 in the thickness direction of the housing 2 is small enough that an ordinary coaxial cable is not able to be arranged in the space.

The flat cable 201 according to the first preferred embodiment of the present invention is preferably arranged in the housing 2 so that the thickness direction of the flat cable 201 coincides with the thickness direction of the housing 2 to allow the flat cable 201 to pass between the battery pack 4 and the housing 2. Accordingly, the circuit boards 3A and 3B that are spaced from each other with the battery pack 4 arranged in the middle are electrically connected to each other by the flat cable 201.

Furthermore, even if the positions at which the flat cable 201 is electrically connected to the circuit boards 3A and 3B and the surface of the battery pack 4 on which the flat cable 201 is installed are different from each other in the thickness direction of the housing 2, and the flat cable 201 needs to be curved to be electrically connected, the structure of the first preferred embodiment is able to be applied.

Moreover, since the flat cable 201 is small in the width direction, a plurality of transmission lines may be arranged in parallel or substantially parallel to each other in the housing 2.

Second Preferred Embodiment

Figure 5:
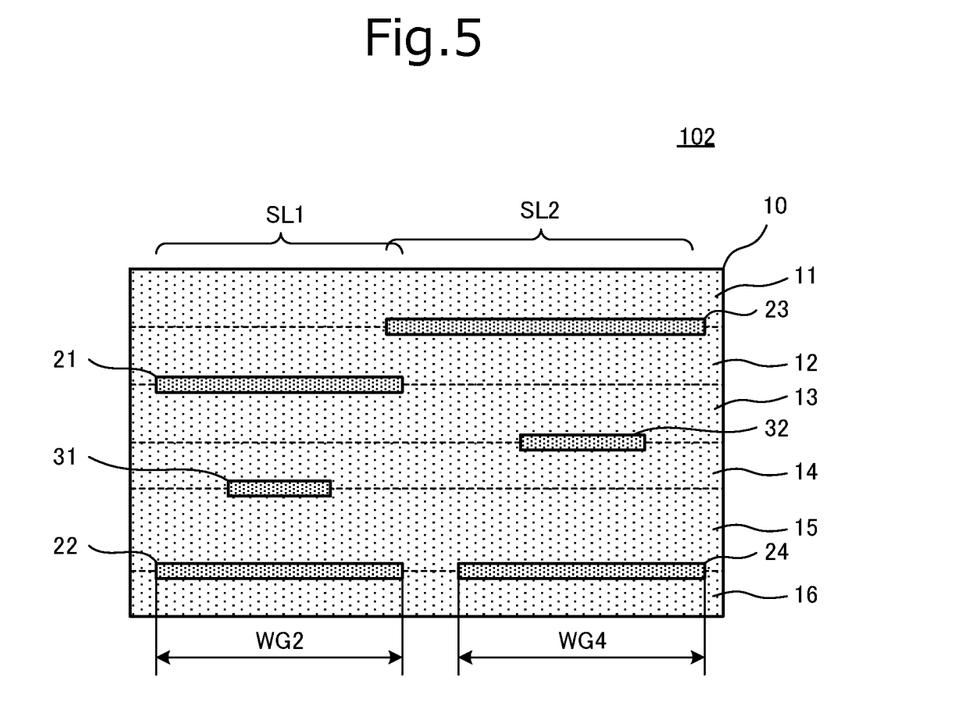
FIG. 5 is a cross-sectional view of a transmission line according to a second preferred embodiment of the present invention.

FIG. 5 is a cross-sectional view of a transmission line 102 according to a second preferred embodiment of the present invention. Unlike the transmission line 101 described in the first preferred embodiment of the present invention, the transmission line 102 is provided with a second ground conductor pattern 22 and a fourth ground conductor pattern 24. The width WG2 of the second ground conductor pattern 22 is preferably larger than the width WS1 of the first signal conductor pattern 31. In addition, the width WG4 of the fourth ground conductor pattern 24 is preferably larger than the width WS2 of the second signal conductor pattern 32. The first signal conductor pattern 31, in a plan view, overlaps the first ground conductor pattern 21 and the second ground conductor pattern 22 and does not overlap at least one of the third ground conductor pattern 23 and the fourth ground conductor pattern 24. Similarly, the second signal conductor pattern 32, in the plan view, overlaps the third ground conductor pattern 23 and the fourth ground conductor pattern and does not overlap at least one of the first ground conductor pattern 21 and the second ground conductor pattern 22. Other features of the transmission line 102 according to the second preferred embodiment are the same or substantially the same as the features of the transmission line 101 described in the first preferred embodiment.

In the transmission line 102 shown in FIG. 5, the first signal conductor pattern 31, the first ground conductor pattern 21, and the second ground conductor pattern 22 define a first transmission line portion SL1 with a stripline structure. In addition, the second signal conductor pattern 32, the third ground conductor pattern 23, and the fourth ground conductor pattern 24 define a second transmission line portion SL2 with a stripline structure.

Accordingly, for two transmission line portions that are adjacent to or in a vicinity of each other, the upper and lower ground conductor patterns of the two transmission line portions are separated from each other, and the leakage of a signal between the transmission lines by the feedback current through the ground conductor pattern is able to be further significantly reduced or prevented.

Third Preferred Embodiment

Figure 6:
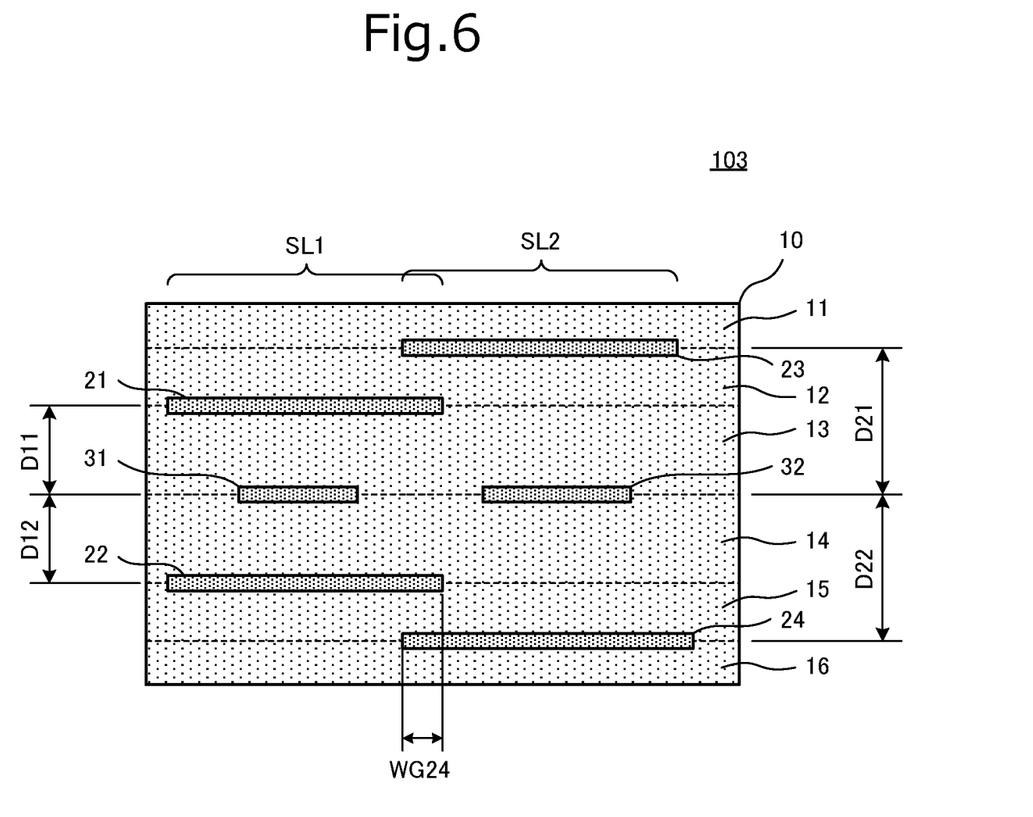
FIG. 6 is a cross-sectional view of a transmission line according to a third preferred embodiment of the present invention.

FIG. 6 is a cross-sectional view of a transmission line 103 according to a third preferred embodiment of the present invention. Both the first signal conductor pattern 31 and the second signal conductor pattern 32 of the transmission line 103 are provided on the common insulator layer 14. In addition, the second ground conductor pattern 22 is provided on the insulator layer 15, and the fourth ground conductor pattern 24 is provided on the insulator layer 16. Therefore, the third ground conductor pattern 23 is arranged outside the first ground conductor pattern 21, and the fourth ground conductor pattern 24 is arranged outside the second ground conductor pattern 22. Other features of the transmission line 103 according to the third preferred embodiment are the same or substantially the same as the features of the transmission line 101 described in the first preferred embodiment.

In the transmission line 103 as shown in FIG. 6, the second ground conductor pattern 22 and the fourth ground conductor pattern 24 overlap each other only by a distance WG24 in a plan view. Accordingly, the second ground conductor pattern 22 and the fourth ground conductor pattern 24 are provided on different insulator layers among the plurality of insulator layers and at least partially overlap each other in a plan view. According to this structure, coupling through the second ground conductor pattern 22 and the fourth ground conductor pattern 24 is significantly reduced or prevented. Therefore, even if the distance between the first signal conductor pattern 31 and the second signal conductor pattern 32 is made comparatively small, a predetermined isolation is able to be provided and thus the width of the entire transmission line is able to be reduced. In addition, the second ground conductor pattern 22 and the fourth ground conductor pattern 24 are stacked and overlap in a plan view, and the undesired radiation toward the surface (a downward direction in FIG. 6) on which the second ground conductor pattern 22 and the fourth ground conductor pattern 24 are provided is able to be significantly reduced or prevented.

Fourth Preferred Embodiment

Figure 7:
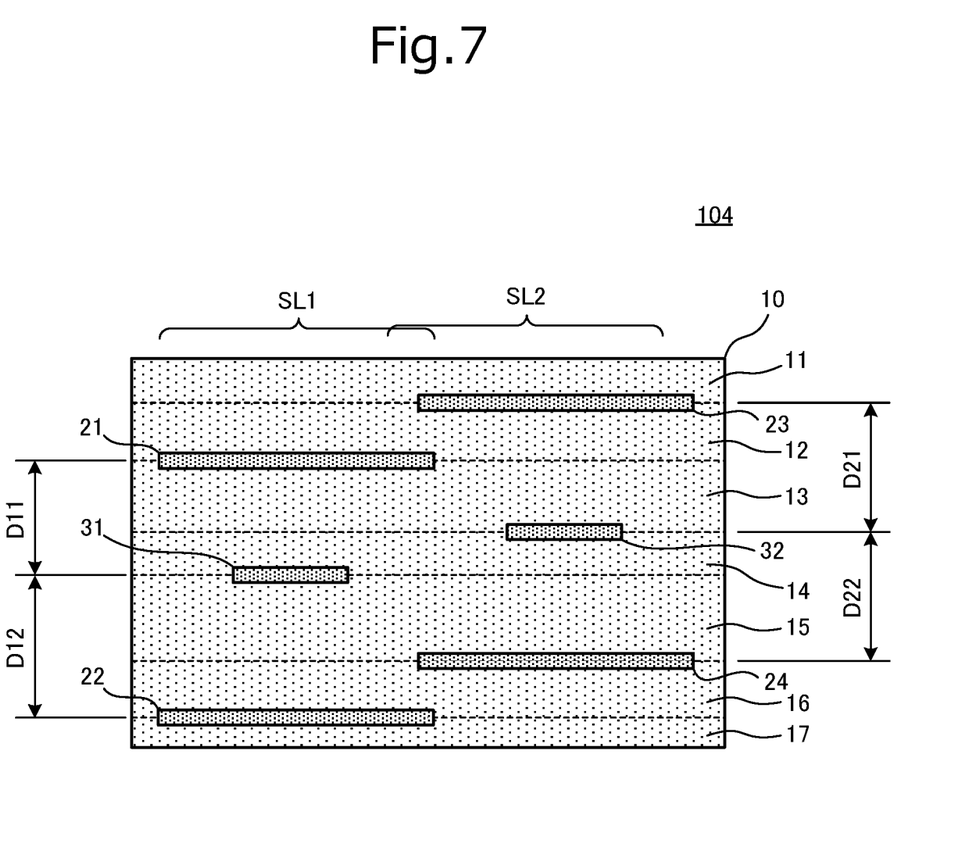
FIG. 7 is a cross-sectional view of a transmission line according to a fourth preferred embodiment of the present invention.

FIG. 7 is a cross-sectional view of a transmission line 104 according to a fourth preferred embodiment of the present invention. The transmission line 104 includes the first signal conductor pattern 31 that is provided on the insulator layer 15 and the second signal conductor pattern 32 that is provided on the insulator layer 14. The first ground conductor pattern 21 is provided on the insulator layer 13, and the second ground conductor pattern 22 is provided on the insulator layer 17. In addition, the third ground conductor pattern 23 is provided on the insulator layer 12, and the fourth ground conductor pattern 24 is provided on the insulator layer 16. Therefore, the first transmission line portion SL1 including the first signal conductor pattern 31, the first ground conductor pattern 21, and the second ground conductor pattern 22; and the second transmission line portion SL2 including the second signal conductor pattern 32, the third ground conductor pattern 23, and the fourth ground conductor pattern 24 are able to be entirely offset from each other in a stacking direction of the plurality of insulator layers. Other features of the transmission line 104 according to the fourth preferred embodiment are the same or substantially the same as the features of the transmission line 101 described in the first preferred embodiment.

In the transmission line 104 as shown in FIG. 7, a three dimensional distance between the first signal conductor pattern 31 and the second signal conductor pattern 32 is able to be comparatively large, which provides increased isolation between the two transmission line portions SL1 and SL2. In addition, the first ground conductor pattern 21 and the third ground conductor pattern 23 are provided on different insulator layers among the plurality of insulator layers and at least partially overlap each other in a plan view, and the second ground conductor pattern 22 and the fourth ground conductor pattern 24 are provided on different insulator layers among the plurality of insulator layers and at least partially overlap each other in a plan view. Accordingly, the leakage of a signal between the transmission lines due to the feedback current through each ground conductor pattern is able to be significantly reduced or prevented. Moreover, the undesired radiation in the thickness direction (a vertical direction in FIG. 7) of the transmission line 104 is also significantly reduced or prevented.

Fifth Preferred Embodiment

FIGS. 8A to 8D are partial plan views showing several examples of a ground conductor pattern provided in a transmission line according to a fifth preferred embodiment of the present invention.

Figure 8A:
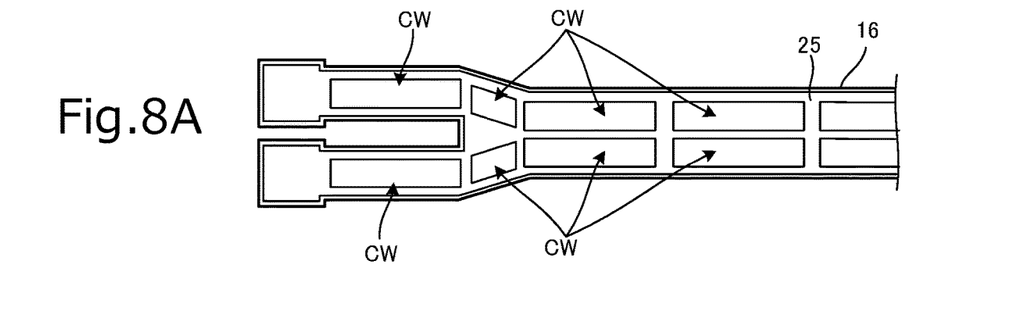
FIGS. 8A to 8D are partial plan views showing several examples of a ground conductor pattern provided in a transmission line according to a fifth preferred embodiment of the present invention.
Figure 8B:
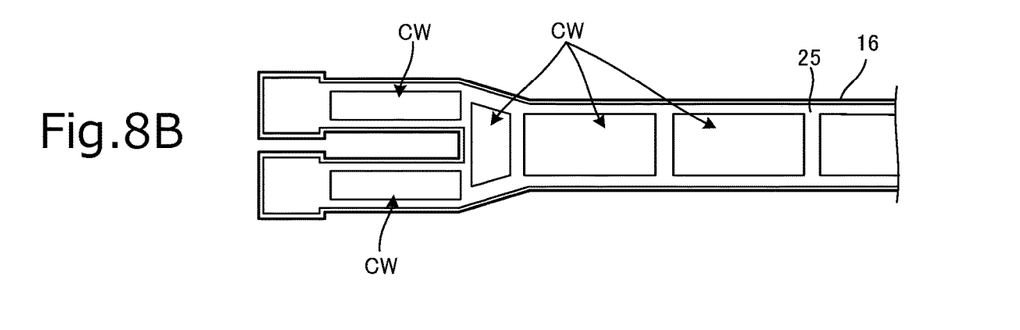

FIGS. 8A and 8B show the second-fourth common ground conductor pattern 25 provided on the insulator layer 16 as shown in FIG. 3 of the first preferred embodiment of the present invention. As shown in FIGS. 8A and 8B, the second-fourth common ground conductor pattern 25 includes a conductor opening portion (conductor non-formed portion) CW. In other words, the second-fourth common ground conductor pattern 25 preferably is ladder-shaped or mesh-shaped. The features and arrangement of the various conductor patterns provided on other insulator layers are as shown in FIG. 3.

Figure 8C:
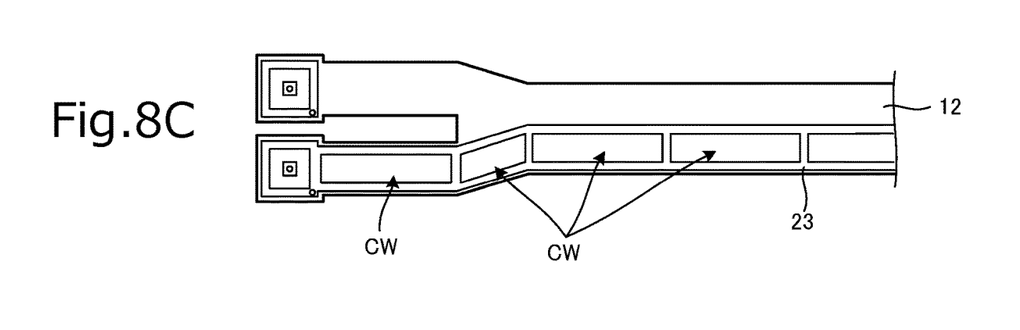
Figure 8D:
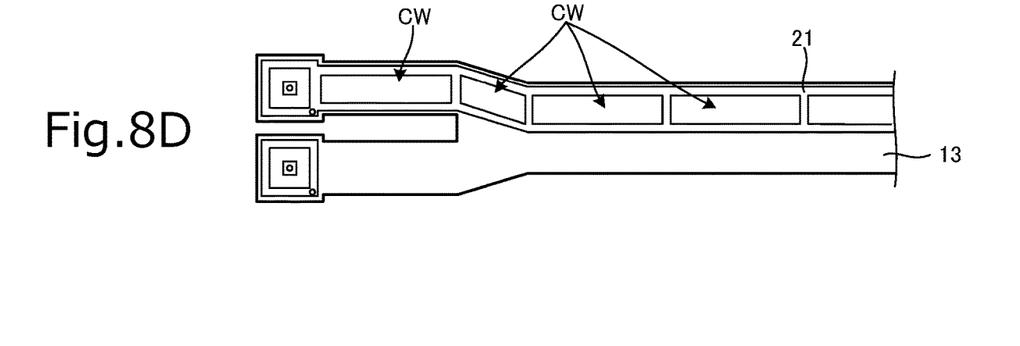

FIG. 8C shows the third ground conductor pattern 23 provided on the insulator layer 12 as shown in FIG. 3 of the first preferred embodiment of the present invention. As shown in FIG. 8C, the third ground conductor pattern 23 includes a conductor opening portion CW. Similarly, FIG. 8D shows the first ground conductor pattern 21 provided on the insulator layer 13 as shown in FIG. 3 of the first preferred embodiment of the present invention. As shown in FIG. 8D, the first ground conductor pattern 21 includes a conductor opening portion CW.

With respect to the example shown in FIGS. 8A and 8B, if the second-fourth common ground conductor pattern 25 includes the conductor opening portion CW, and the first ground conductor pattern 21 and the third ground conductor pattern 23 do not include the conductor opening portion CW, the undesired radiation toward the surface on which the first ground conductor pattern 21 and the third ground conductor pattern 23 are provided is able to be significantly reduced or prevented.

In addition, with respect to the example shown in FIGS. 8C and 8D, if the second-fourth common ground conductor pattern 25 does not include the conductor opening portion CW, and the first ground conductor pattern 21 and the third ground conductor pattern 23 include the conductor opening portion CW, unwanted coupling (crosstalk) of signals through the second-fourth common ground conductor pattern 25 is able to be significantly reduced or prevented. In other words, unwanted coupling between the first signal conductor pattern 31 and the second signal conductor pattern 32 does not occur through a magnetic field to be generated with the leakage of electromagnetic waves leaked from the conductor opening portion CW of the second-fourth common ground conductor pattern 25.

According to the structure shown in FIGS. 8A and 8B, the capacitance generated between the second-fourth common ground conductor pattern 25 and the first signal conductor pattern 31, and the capacitance generated between the second-fourth common ground conductor pattern 25 and the second signal conductor pattern 32 become smaller, as shown in FIG. 2. Therefore, the insulator layer 15 is able to be made thinner, and the overall thickness of transmission line and the flat cable is able to be reduced.

Similarly, according to the structure shown in FIGS. 8C and 8D, the capacitance generated between the first ground conductor pattern 21 and the first signal conductor pattern 31 and the capacitance generated between the third ground conductor pattern 23 and the second signal conductor pattern become smaller, as shown in FIG. 2. Therefore, the insulator layer 13 is able to be made thinner (preferably in addition to the insulator layer 12 being made thinner), and the overall thickness of the transmission line and the flat cable is able to be reduced.

Similarly, in the structure shown in FIG. 5 to FIG. 7, each ground conductor pattern may include the conductor opening portion CW.

While the several preferred embodiments described above have described an example in which two transmission line portions are included in a stacked insulator, three or more transmission line portions may be included in a stacked insulator. Even in such a case, the two transmission line portions that are adjacent to or in a vicinity of each other and include the features of a preferred embodiment of the present invention are able to be provided as a transmission line that is small in the width direction and has less crosstalk.

In addition, an interlayer connection conductor may be arranged at predetermined intervals between two signal conductor patterns in parallel or substantially parallel to each other. For example, in the structure shown in FIG. 5 to FIG. 7, an interlayer connection conductor that electrically connects the first ground conductor pattern 21 and the second ground conductor pattern 22 may be arranged at predetermined intervals. Similarly, an interlayer connection conductor that electrically connects the third ground conductor pattern 23 and the fourth ground conductor pattern 24 may be arranged at predetermined intervals. Furthermore, in the structure shown in FIG. 2, an interlayer connection conductor that electrically connects the first ground conductor pattern 21 and the second-fourth common ground conductor pattern 25 may be arranged at predetermined intervals. Accordingly, an interlayer connection conductor is arranged between two signal conductor patterns in parallel or substantially parallel to each other, and the isolation between the first transmission line portion SL1 and the second transmission line portion SL2 is able to be further provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A transmission line comprising:
 a stacked insulator in which a plurality of insulator layers are stacked; and
 a conductor pattern arranged along at least one of the plurality of insulator layers in the stacked insulator; wherein
 the conductor pattern includes:
  a first transmission line portion including:
   a first ground conductor pattern;
   a second ground conductor pattern; and
   a first signal conductor pattern, and
  a second transmission line portion including:
   a third ground conductor pattern;
   a fourth ground conductor pattern; and
   a second signal conductor pattern;
 the first signal conductor pattern extends along the second signal conductor pattern;
 each of the first ground conductor pattern, the second ground conductor pattern, the third ground conductor pattern, and the fourth ground conductor pattern includes a width that is larger than a width of each of the first signal conductor pattern and the second signal conductor pattern;
 the first ground conductor pattern and the second ground conductor pattern are respectively located on one side and another side of the first signal conductor pattern in a stacking direction of the plurality of insulator layers;
 the first signal conductor pattern, in a plan view, overlaps the first ground conductor pattern and the second ground conductor pattern and does not overlap at least one of the third ground conductor pattern and the fourth ground conductor pattern;

the third ground conductor pattern and the fourth ground conductor pattern are respectively located on one side and another side of the second signal conductor pattern in the stacking direction of the plurality of insulator layers;

the second signal conductor pattern, in a plan view, overlaps the third ground conductor pattern and the fourth ground conductor pattern and does not overlap at least one of the first ground conductor pattern and the second ground conductor pattern;

at least the first ground conductor pattern and the third ground conductor pattern are provided on different insulator layers among the plurality of insulator layers and at least partially overlap each other in a plan view;

the second ground conductor pattern and the fourth ground conductor pattern are provided on a same insulator layer among the plurality of insulator layers and are a planar conductor formed as a continuum overlapping the first signal conductor pattern and the second signal conductor pattern in a plan view; and a distance between the third ground conductor pattern and the fourth ground conductor pattern in the stacking direction of the plurality of insulator layers is larger than a distance between the first ground conductor pattern and the second ground conductor pattern in the stacking direction of the plurality of insulator layers.

2. The transmission line according to claim 1, wherein the first signal conductor pattern and the second signal conductor pattern are provided on different insulator layers among the plurality of insulator layers.

3. The transmission line according to claim 1, wherein at least one of the first ground conductor pattern and the third ground conductor pattern include conductor opening portions.

4. A flat cable comprising:
the transmission line according to claim 1.

5. The flat cable according to claim 4, further comprising:
a curved portion; wherein
the curved portion is curving in the stacking direction.

6. The flat cable according to claim 4, further comprising:
at least one connector electrically connected to the transmission line; wherein
the at least one connector is mounted on the stacked insulator of the transmission line.

7. The flat cable according to claim 6, wherein the at least one connector is a coaxial connector.

8. The flat cable according to claim 6, wherein the at least one connector includes four connectors that are provided at both ends of each of the first and second transmission line portions.

9. An electronic device comprising:
the flat cable according to claim 4.

10. The electronic device according to claim 9, wherein the flat cable includes a plurality of the transmission lines.

11. The electronic device according to claim 9, wherein
the flat cable includes a curved portion; and
the curved portion is curving in the stacking direction.

12. The electronic device according to claim 9, further comprising:
at least one connector electrically connected to the transmission line; wherein
the at least one connector is mounted on the stacked insulator of the transmission line.

13. The electronic device according to claim 12, wherein the at least one connector is a coaxial connector.

14. The electronic device according to claim 12, wherein the at least one connector includes four connectors that are provided at both ends of each of the first and second transmission line portions.

15. The transmission line according to claim 1, wherein there is no conductor pattern between the first signal conductor pattern and the second ground conductor pattern and between the second signal conductor pattern and the fourth ground conductor pattern in the stacking direction.

* * * * *